United States Patent [19]

Miller

[11]  4,382,224

[45]  May 3, 1983

[54] ELECTRONIC SYSTEM FOR HIGH POWER LOAD CONTROL

[75] Inventor: Emmett L. Miller, Long Beach, Calif.

[73] Assignee: The United States of America as represented by the Administrator of the National Aeronautics and Space Administration, Washington, D.C.

[21] Appl. No.: 219,968

[22] Filed: Dec. 24, 1980

[51] Int. Cl.$^3$ ............................................... G05F 1/44
[52] U.S. Cl. .................................... 323/269; 323/303; 323/350
[58] Field of Search ....................... 323/269, 303, 350; 330/295

[56] References Cited

U.S. PATENT DOCUMENTS 3,094,654  6/1963  Roelli ................................. 323/269
3,509,448  4/1970  Bland .................................. 323/269

FOREIGN PATENT DOCUMENTS 42-8867  4/1967  Japan .................................. 323/269

Primary Examiner—William M. Shoop

Attorney, Agent, or Firm—Paul F. McCaul; John R. Manning; Thomas H. Jones

[57]  ABSTRACT

An electronic control system for a high power load is provided with a plurality of parallel current paths divided into two groups (11-12), with control devices ($Q_1$-$Q_n$) in the current paths of one group each having a current limiting resistor (13), and control devices ($Q_{21}$, $Q_{22}$) in the current paths of the other group each having no current limiting resistor, so that when the control devices of the second group are turned fully on, a short circuit is achieved by the arrangement of parallel current paths. Separate but coordinated control signals (1, 2) are provided by suitable means ($P_1$-$P_3$) to first turn on the control devices of the first group and increase their conduction toward saturation as a function of control input, and when fully on, or shortly before, to turn on the control devices of the second group and increase their conduction toward saturation as a function of the control input as that input continues to increase. Electronic means (32-35) may be employed to generate control signals (1, 2). The system may be used for I-V characteristic measurements of solar arrays, as well as for other load control purposes.

8 Claims, 6 Drawing Figures

ELECTRONIC SYSTEM FOR HIGH POWER LOAD CONTROL

ORIGIN OF INVENTION

The invention described herein was made in the performance of work under a NASA contract and is subject to the provisions of Section 305 of the National Aeronautics and Space Act of 1958, Public Law 85-568 (72 Stat. 435; 42 USC 2457).

BACKGROUND OF THE INVENTION

This invention relates to an electronic system which controls current from a high voltage, high power source in response to a low input signal, and thereby produces as an output an amplification of the input signal.

Many electronic devices are available for control of current to a load in response to a low input signal, such as an electron tube or transistor. Most have the ability to produce an output at all times proportionate to its input over a substantial range. Transistors are, of course, the preferred devices because of their low power losses. However, their use to control high voltage, high power systems has been limited. For example, when such an electronic control system is connected to a solar array for testing, such as to plot its current-voltage (I-V) characteristic curve, the open circuit voltage ($V_{oc}$) may be over 300 volts, and the short circuit current ($I_{sc}$) may be over two amperes. This is well over the rated maximum of most commercially available electronic load control systems.

Although high voltage power transistors are readily available, problems of second breakdown (in bipolar transistors) and power dissipation limit any single transistor to operation at relatively low currents when at high voltage or low voltages when at high current. Thus, a single transistor may be satisfactory for switching between these two states, but cannot carry a sustained high current at high voltages. Use of high voltage bipolar transistors to control the load requires relatively large numbers of parallel current paths, and great care in matching these currents, to prevent current hogging and second breakdown destruction of the transistors.

Power MOSFET's with high voltage ratings and reduced on-resistance have now become available. These transistors are immune to second breakdown, have larger safe operating areas of their current-voltage characteristic curves and are easy to operate in parallel. However, to stay within their safe operating region, it is still necessary to use multiple parallel current paths or current limiting resistors in series with the MOSFET's, except at lower voltages. These resistors would prevent the continuation of the I-V curve down to zero voltage because of the voltage drop across them. The present invention provides an arrangement of parallel current paths which overcomes this deficiency, permitting these parallel current paths to share the current load from open circuit ($V_{oc}$) to short circuit ($V_{sc}$).

SUMMARY OF THE INVENTION

In accordance with the present invention, a plurality of parallel current paths are divided into two groups, with control devices in the current paths of one group each having a current limiting resistor, and control devices in the current paths of the other group each having no current limiting resistor so that when the control devices of the second group are turned fully on, a short circuit is achieved by the arrangement of parallel current paths. Separate but coordinated control signals are provided by suitable means to first turn on the control devices of the first group and increase their conduction toward saturation as a function of control input, and when fully on, or shortly before, to turn on the control devices of the second group and increase their conduction toward saturation as a function of the control input as that input continues to increase. When ganged potentiometers ($P_1$, $P_2$) are used to produce the signals (1 and 2), a third potentiometer ($P_3$) is used to provide a fixed offset for one signal (1) chosen to cause devices controlled by it to reach saturation at the time, or shortly after, the second signal (2) turns the second group of devices on. Electronic means (32-35) may be used to generate the control signals (1, 2), each with the same slope as a function of a control input signal. The system may be used for I-V characteristic measurements of solar arrays, as well as for other load control purposes.

The novel features that are considered characteristic of this invention are set forth with particularity in the appended claims. The invention will best be understood from the following description when read in connection with the accompanying drawings.

DESCRIPTION OF PREFERRED EMBODIMENTS

Figure 1:
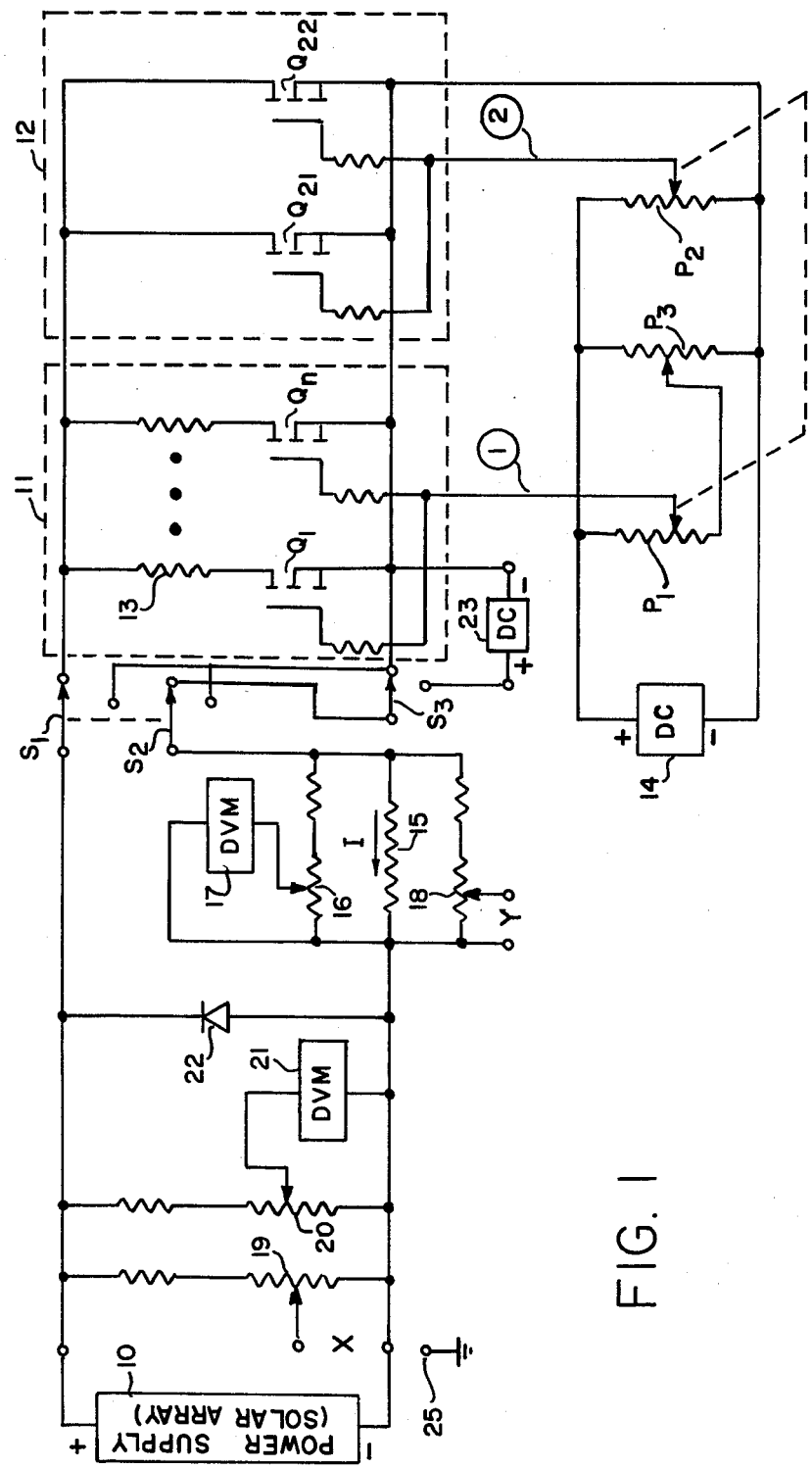
FIG. 1 is a circuit diagram of an exemplary embodiment of the invention.

Referring to FIG. 1 of the drawings, a preferred embodiment of the invention is disclosed for an exemplary application, namely a portable, manual sweep, high-voltage electronic load to perform I-V curve measurements on a solar array 10 where open circuit voltages may be as high as 350 volts, and short circuit currents as high as 2.5 amperes. However, this exemplar is only by way of illustration, and not by way of limitation. It will be readily appreciated that the present invention may be used for other purposes, such as an amplifier for a servomotor or a large audio amplifier, as will be more explicitly pointed out hereinafter.

Figure 2:
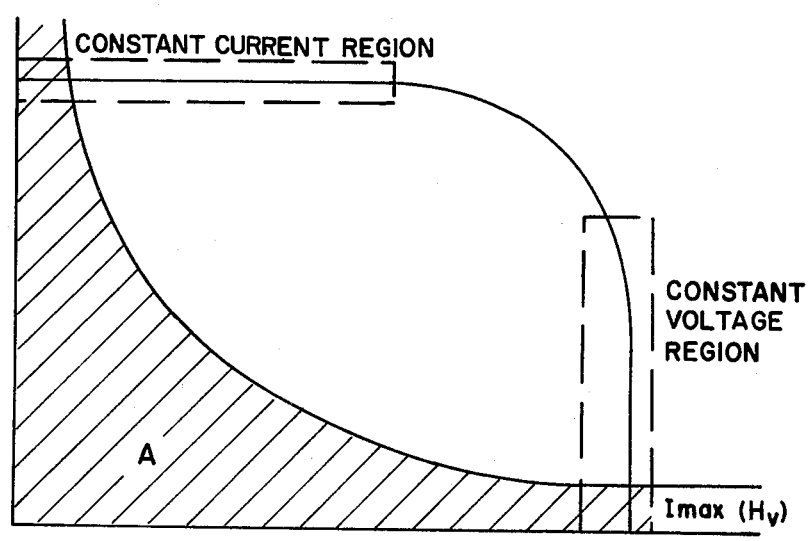
FIG. 2 illustrates a graph constant voltage and constant current regions of an I-V characteristic curve for a solar array, and the safe operating area A of power transistors.

It should also be recognized that although transistors $Q_1$-$Q_n$ and $Q_{21}$, $Q_{22}$ are used in this exemplar, other electronic control devices may be used, such as electron tubes. Power transistors have a safe operating area of the I-V realm, bordered by a more-or-less parabolic curve of maximum power dissipation indicated by an area A below a parabolic curve shown in FIG. 2. Also shown in FIG. 2 is an idealized solar array I-V curve, consisting of two quite different regions, a constant voltage region B and a constant current region C.

High power MOSFET's ("Hexfets" from International Rectifier Corporation) were chosen for the transistors instead of the commonly used bipolar transistors for two reasons. First, they are immune from second breakdown and have a relatively high safe operating region on the I-V plot, limited only by the package power dissipation rating. Second, their inherently self-limiting current characteristic (with temperature) is an advantage. This makes it rather simple to operate several MOSFET's in parallel, with no problems of current mismatch or "hogging".

At lower voltages, the array 10 acts somewhat as a constant current source, while at high voltages (approaching the open circuit voltage) the array behaves as a nearly constant voltage source. As indicated in FIG. 2, a single transistor might be capable of handling the entire array current near the short circuit condition (low voltage) but could handle only a fraction of the array current, shown as I max ($H_v$), near the high voltage limit of the array.

For moderate voltage arrays (e.g., 50 volts), a group of transistors operating in parallel can split the array current to solve this problem. However, as the open-circuit voltage is increased, there is a corresponding decrease in I max ($H_v$), necessitating the use of proportionally more parallel transistors with attendant problems of complexity, cost and matching.

An alternative approach is to use a series resistance in each transistor-controlled current path. This reduces the voltage on the transistor as the current increases and can thus keep the transistor within its safe operating region. However, the series resistances in each parallel current path would constitute a minimum load, preventing the array voltage from reaching the short circuit current condition (0 volts).

To overcome these problems, two groups of parallel current paths (11, 12) are used, each with a MOSFET device for electronic control of current therethrough. Each of the transistors $Q_1$ through $Q_n$ of the first group 11 includes a separate series (current limiting) resistor, such as resistor 13 connected to the drain of the transistor $Q_1$. This first group of transistors, operating in parallel covers the high voltage range extending from the open circuit condition ($V_{oc}$) in the constant voltage region B part of the way into the constant current region C. The second group of transistors $Q_{21}$, $Q_{22}$ are turned on when the first group have reached the fully-on state. They then take over the load and approach the short circuit current ($I_{sc}$) condition.

Figure 3:
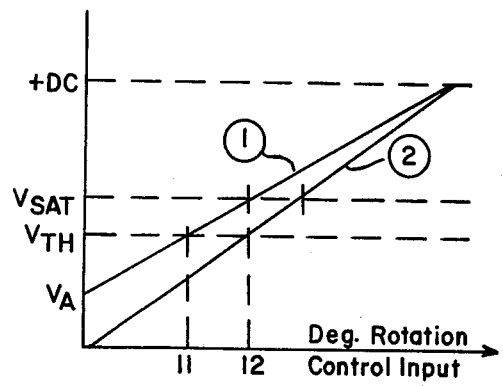
FIG. 3 is a graph illustrating two coordinated control signals generated for the system of FIG. 1 as a function of a control input.

The control signals for the two groups of transistors operated in parallel are applied to their control (gate) electrodes over leads 1 and 2 from ganged potentiometers $P_1$ and $P_2$ connected to a source of DC bias voltage 14. A separate isolating resistor R is connected in series with the gate of each device. As the moving contact (wiping arm) of the potentiometers move in unison from the bottom towards the top in FIG. 1, the signal on line 2 increases linearly from zero to +DC, while the signal on line 1 increases from a predetermined offset voltage $V_A$ to +DC. The signal on line 1 crosses the threshold level, $V_{TH}$, for turning on the transistors first, as shown in FIG. 3, so only the first group of transistors conduct. When the signal on line 1 reaches the saturation control level, $V_{SAT}$, the first group of transistors are fully on. At the same time, the signal on the line 2 reaches the threshold level for turning on the transistors, at which time the second group of transistors are turned on. At that time, or shortly before, the second group of transistors without current limiting resistors begin to conduct. They take over the task of increasing the load on the solar array as they are turned on and approach the short circuit condition at saturation.

Figure 5:
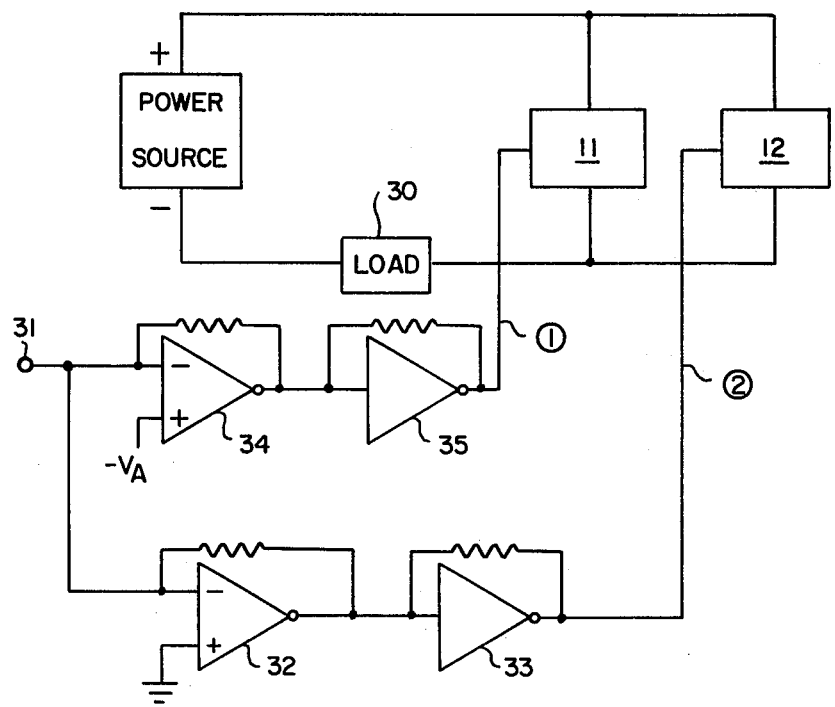
FIG. 5 is a schematic diagram illustrating the use of the present invention as an amplifier to drive a load from a high power source with a small input signal.

Since both control signals reach +DC at the same time, it is apparent that the rate at which the second group of transistors are turned on is greater than for the first group of transistors. There is thus linearity only as to each group. For the two groups taken together, there is a change in the slope of the control signal from one group to the next. This is not a problem for this application of I-V curve measurements for the solar array 10. For other applications, this could be corrected by placing a resistor of appropriate value in series between the potentiometer $P_2$ and the DC source 14, in which case the signal on line 2 would not reach the +DC level, but would provide a signal that varies as a function of the degree of rotation of the potentiometer (i.e., the control input) with the same slope as the signal 1. Some adjustment in the offset voltage $V_A$ and the DC source 14, would then be required to place the intersection of the signal 1 with the saturation level directly above the intersection of the signal 2 with the threshold level for the second group of transistors to be turned on as the first group reaches saturation. Alternatively the two signals on lines 1 and 2 could be generated as shown in FIG. 5 and discussed below.

For this application of making I-V curve measurements, the current is measured as a voltage across a low value resistor 15 is parallel with two high value resistive branches, one of which includes a potentiometer 16 for a digital voltmeter 17, and another which includes a potentiometer 18. The voltage is measured across a potentiometer in a resistive branch in parallel with a second resistive branch that includes a potentiometer 20 connected to a digital voltmeter 21. These digital voltmeters permit reading out the current and voltage to a high degree of accuracy. The potentiometers 18 and 19 permit scaled current and voltage measurement signals to be derived for driving conventional apparatus for plotting current versus voltage as the potentiometers $P_1$ and $P_2$ are operated together from their lower position to their upper position.

A diode 22 protects the transistors from high negative switching transients as a pair of ganged switches $S_1$ and $S_2$ are operated from their normal position shown to their alternative (short) position, at which time the current for the short condition can be measured. A switch $S_3$ is provided for connecting a DC offset voltage source 23 in series when array voltages of 2 volts or less is required, i.e., when plotting current for very low voltages near zero volts. This offset voltage permits plotting the I-V curve to zero volts and across the Y-axis to a negative voltage. Otherwise zero volts can only be approached, and not reached due to voltage drops across the small internal series resistance of the transistors.

Figure 4:
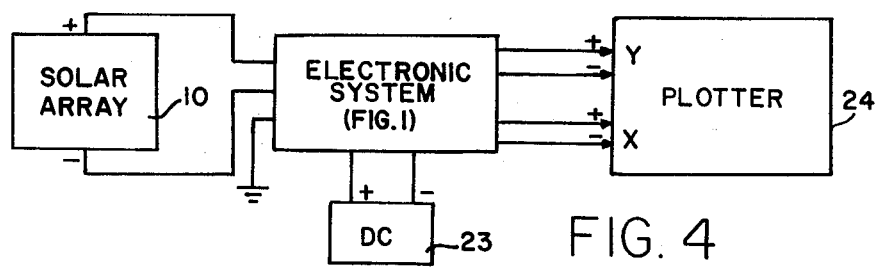
FIG. 4 is a block diagram of the system of FIG. 1 in use for plotting an I-V characteristic curve of a solar array.

FIG. 4 shows the necessary connections of the electronic system shown in FIG. 1 to the array 10 and an X-Y plotter or recorder 24 and the DC voltage source 23. The negative input of the system is floating, but common with X-Y negative outputs. This negative input may be connected to a ground terminal 25 on the system chassis. This option permits I-V measurements on a solar array which requires a floating ground; otherwise the negative input of the system is connected to the ground terminal.

For I-V characteristic measurements of the solar array 10, the control potentiometers $P_1$ and $P_2$ are initially turned fully down. With the solar array still disconnected, the digital voltmeters 17 and 21 should read zero current and voltage. With the switch $S_3$ in its alternate position, the voltmeter 21 should read near the voltage of the source 23. With the switches $S_1$ and $S_2$ in their normal position, the array is connected to the system. The voltmeter 21 should read the array open circuit voltage, $V_{oc}$, and the ampere meter 17 should read zero. While the plotter 24 is rendered operative, the I-V control potentiometers $P_1$ and $P_2$ are then moved upwardly to plot the I-V characteristic curve from $V_{oc}$ to zero volts.

In an exemplary embodiment, eight "Hexfet" transistors are included in the first group and two in the second group. Each of the current limiting resistors in the first group is a 500 ohm, 50 watt series resistor, and each of the isolating resistors R in both groups is 150 ohms. The maximum current which can be handled by the system is limited by the current limiting resistors to 2.5 amperes. The 500 ohm value was chosen to keep the transistors within their safe operating region. The two transistors without current limiting resistors are held off until the first eight are turned on to saturation, or very near saturation, by the potentiometer $P_1$. Both potentiometers $P_1$ and $P_2$ are selected to be 1K ohm. Each potentiometer operates over a different voltage range to set the different turn-on points for the two groups of transistors. The potentiometer $P_3$ is 100 ohms.

With current limiting resistors of higher wattage, fewer transistors would be needed in the first group, or higher currents could be handled. For example, if it is desired to handle four amperes, the eight transistors could be used with 125 watt current limiting resistor for 0.5 ampere through each 500 ohm resistor. Alternatively, ten transistors in the first group with 80 watt current limiting resistors would suffice. In either case, four additional transistors without series resistors would be required to handle the high current, low voltage region of the I-V curve, i.e., the "constant current region."

For use of the system as a high power amplifier, the elements 15 through 18 would be replaced by a load 30, such as a servometer, and the switches $S_1$ through $S_3$ and the elements 19 through 23 would be omitted, as shown in FIG. 5. In place of the DC source 14 and potentiometers $P_1$ through $P_3$, an electronic control signal generator would be provided.

Figure 6:
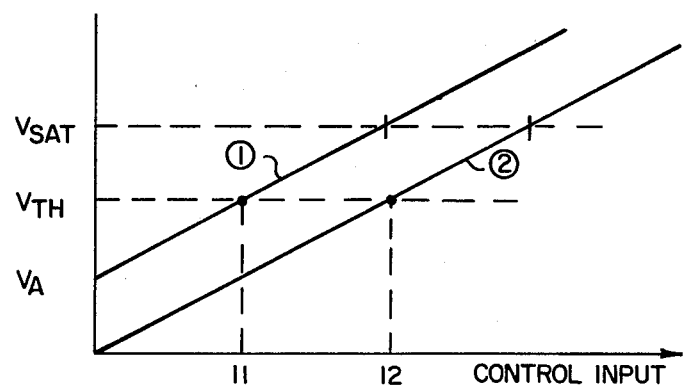
FIG. 6 is a graph illustrating coordinated control signals for the system of FIG. 5 as a function of a small input signal.

The electronic control signal generator responds to an input signal at terminal 31 and produces a linear output signal through two inverting operational amplifiers 32 and 33 in cascade for the second group of transistors 12. The input signal is also applied to two inverting operational amplifiers 34 and 35 in cascade. An offset voltage $(-V_A)$ is applied to the amplifier 34. The gain of the two sets of cascaded amplifiers is equal to produce signals 1 and 2 as shown in FIG. 6.

It should now be apparent that a high power amplifier is provided by the system disclosed, which draws current from a high power source in response to a low current input signal. Although particular embodiments of the invention have been described and illustrated herein, it is recognized that modifications and variations may readily occur to those skilled in the art. Consequently, it is intended that the claims be interpreted to cover such modifications and equivalents.

What is claimed is:

1. A system for control of a plurality of electronic devices in parallel current paths to share a load current from open circuit or high voltage range to short circuit for high current range, with at least one device in each current path, each device having a control terminal, said system comprising a connection to the control terminal of each device of one group for electronic signal control of said one group of devices in parallel, and a current limiting resistor in series with each device in said one group, a connection to the control terminal of each device of the remaining devices in another group for electronic signal control of said other group of devices in parallel, and no current limiting resistor in series with each device in said other group, means for generating a first signal in proportion to a control input for turning on said devices of said one group and increasing their conduction to saturation as said control input increases, and means for generating a second signal in proportion to said control input for turning on said devices of said other group when said devices of said one group reach saturation and increasing their conduction to saturation as said control input increases.

2. A system as defined in claim 1 wherein said devices are MOSFET devices, each with an isolation resistor in series with its control terminal.

3. A system as defined in claim 1 or 2 wherein said means for generating said first signal is comprised of a first potentiometer connected to a source of DC bias voltage and said means for generating said second signal is comprised of a second potentiometer connected to said source of DC bias voltage, said first and second potentiometers being ganged together for operation in unison, and means in series with said first potentiometer to offset the signal generated thereby with respect to the signal generated by said second potentiometer sufficiently to cause said first and second groups of devices to be turned on in sequence in response to a control input in the form of operation of said potentiometers.

4. A system as defined in claim 1 or 2 wherein said means for generating said first signal is comprised of a first electronic amplifying means responsive to a control input in the form of an electrical signal for producing said first signal proportional thereto, said first electronic amplifying means including means for offsetting said control input signal amplified thereby, and a second electronic amplifying means responsive to said control input in the form of an electrical signal for producing said second signal proportional thereto, where said amplifying means each have the same gain factor, and said offset is selected for causing said first and second groups of devices to be turned on in sequence.

5. A system as defined in claim 1 or 2 wherein said plurality of parallel current paths are connected to a solar array, and said devices are operated to measure the current versus voltage characteristics of said array with a high resistance voltage dividing network connected directly in parallel with said array for voltage measurements, and a low resistance current sensing means in series with said array for current measurements.

6. A system as defined in claim 5 including switching means for shunting said parallel current paths for a short circuit current measurement.

7. A system as defined in claim 5, including switching means for connecting a fixed source of offset voltage in series with said two groups of parallel current paths.

8. A system as defined claim 1 or 2 wherein said two groups of parallel current paths are connected parallel to a source of power through a load.

* * * * *